(12) United States Patent
Chaintreuil et al.

(10) Patent No.: US 9,935,226 B2
(45) Date of Patent: Apr. 3, 2018

(54) PHOTOVOLTAIC MODULE WITH SIMPLIFIED CONNECTION

(75) Inventors: Nicolas Chaintreuil, Montmelian (FR); Paul Messaoudi, Chambery (FR); Eric Pilat, Brison-Saint-Innocent (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/235,375

(22) PCT Filed: Jul. 27, 2012

(86) PCT No.: PCT/EP2012/064786
§ 371 (c)(1),
(2), (4) Date: Mar. 6, 2014

(87) PCT Pub. No.: WO2013/017541
PCT Pub. Date: Feb. 7, 2013

(65) Prior Publication Data
US 2014/0246069 A1    Sep. 4, 2014

(30) Foreign Application Priority Data
Jul. 29, 2011   (FR) ..................................... 11 57003

(51) Int. Cl.
*H01L 31/042*    (2014.01)
*H01L 31/05*    (2014.01)
*H01L 31/02*    (2006.01)

(52) U.S. Cl.
CPC ...... *H01L 31/0508* (2013.01); *H01L 31/0201* (2013.01); *Y02E 10/50* (2013.01)

(58) Field of Classification Search
CPC ............. H01L 31/0201; H01L 31/0504; H01L 31/0508
USPC .................................................. 136/243–265
See application file for complete search history.

(56) References Cited

U.S. PATENT DOCUMENTS

| | | | |
|---|---|---|---|
| 4,119,768 A * | 10/1978 | Bayard | H01G 9/20 136/253 |
| 4,371,739 A * | 2/1983 | Lewis et al. | 136/251 |
| 5,043,024 A | 8/1991 | Cammerer et al. | |
| 6,531,653 B1 * | 3/2003 | Glenn et al. | 136/246 |
| 2011/0186113 A1 | 8/2011 | Nishi et al. | |

FOREIGN PATENT DOCUMENTS

| | | |
|---|---|---|
| DE | 41 40 682 A | 6/1993 |
| DE | 10 2005 050883 A | 4/2007 |
| EP | 0 373 235 A | 6/1990 |

(Continued)

OTHER PUBLICATIONS

English translation of Chehab et al., German Patent No. DE4140682.*

(Continued)

*Primary Examiner* — Niki Bakhtiari
(74) *Attorney, Agent, or Firm* — Haug Partners LLP

(57) ABSTRACT

Photovoltaic module (11) comprising a plurality of electrically connected photovoltaic cells (12), characterized in that it has a square shape and comprises at least two contact pads (17, 18) in each corner of the module so as to comprise at least four connectors (14, 15) on each edge (21; 22; 23; 24) of the module.

6 Claims, 3 Drawing Sheets

(56) References Cited

FOREIGN PATENT DOCUMENTS

| | | |
|---|---|---|
| JP | 58-063181 A | 4/1983 |
| JP | 02-42449 U | 3/1990 |
| JP | 06-041156 U | 5/1994 |
| WO | WO 2008/136872 A | 11/2008 |
| WO | WO 2009/063855 A | 5/2009 |

OTHER PUBLICATIONS

Notice of Reasons for Rejection issued by Japanese Patent Office for Japanese application 2014-522110 dated Apr. 5, 2016.

* cited by examiner

PHOTOVOLTAIC MODULE WITH SIMPLIFIED CONNECTION

This application is a 371 of PCT/EP2012/064786 flied on Jul. 27, 2012, published on Feb. 7, 2013 under publication number WO 2013/017541, which claims priority benefits from French Patent Application Number 1157003 filed Jul. 29, 2011, the disclosure of which is incorporated herein by reference.

The invention relates to a photovoltaic module, to a photovoltaic device and to a plant for producing photovoltaic electricity comprising a plurality of these photovoltaic modules.

To install a photovoltaic device, complex cabling is currently needed to connect various modules together to form an electrically connected array. These electrical connections consist, for example, in connecting various modules in series before connecting them to an inverter. These connections require adjacent modules to be electrically connected via connection of their respective terminals, which are located in a junction box placed on their back side. In practice this prior-art connection method requires connectors to be crimped. This has the following drawbacks:

the photovoltaic device is time-consuming and expensive to install; and there is a risk, if a connection is poorly formed, due for example to incorrect crimping, that electrical arcing will cause an accident or will lead the photovoltaic device obtained to malfunction or age prematurely. This results in such a device being unreliable.

Figure 1:
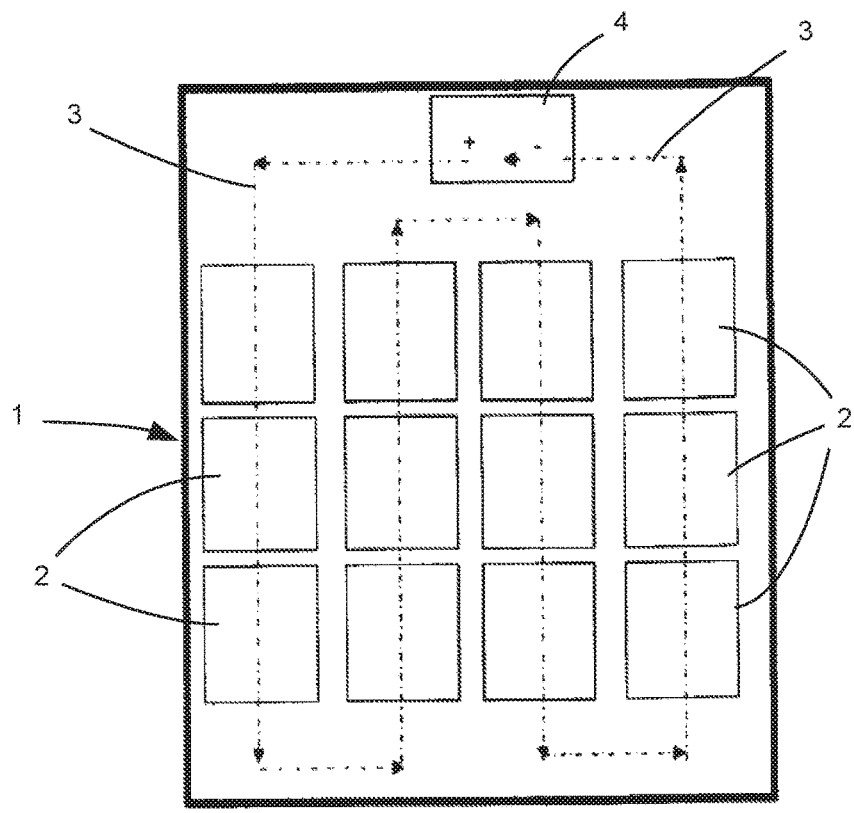

By way of example, FIG. 1 schematically shows a conventional photovoltaic module 1 according to the prior art. This rectangular module 1 comprises a plurality of cells 2 connected together in series by cables 3. The two ends of this electrical connection form the two, positive and negative, poles of the module, which poles are accessible via an electrical connector housed in a junction box 4 arranged on the back side of the module. Such a photovoltaic module 1 is a basic element of a photovoltaic device, which is generally constructed by associating a number of photovoltaic modules.

Figure 2:
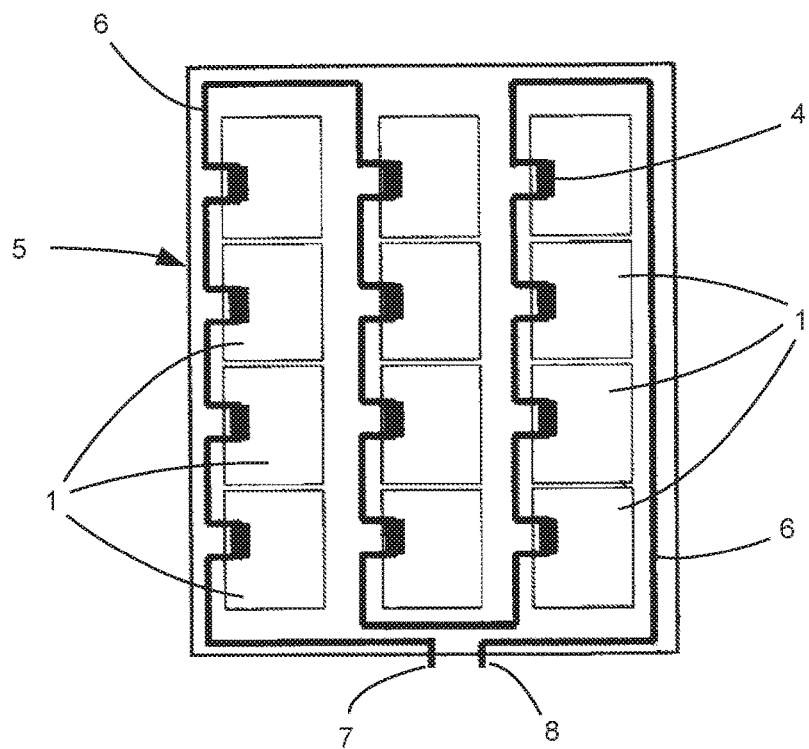

By way of example, FIG. 2 shows a conventional photovoltaic device comprising an array of twelve photovoltaic modules 1 arranged in three columns and electrically connected in series by cables 6 connecting their junction boxes 4 in order to form an electrical path between the two output terminals 7, 8 of the device.

Document WO 2008/136872 describes one particular photovoltaic, module comprising one connection box for each positive and negative pole, which box is located on one edge of the module. This approach is different from the conventional solution described above but does not actually succeed in simplifying assembly of a number of modules as this solution remains inflexible. Furthermore, the proposed interconnections still run the aforementioned risks.

Document WO 2009/063855 describes a photovoltaic module likewise comprising two, positive and negative, poles positioned on two opposite edges of the module. This solution has the same drawbacks as the preceding one.

Other solutions, such as those described in documents DE4140682, JP58063181 and DE102005050883, attempt to improve the preceding solutions but remain unsatisfactory.

Thus, a general objective of the invention is to provide a photovoltaic device installation solution that reduces the drawbacks of the solutions of the prior art.

More precisely, the invention seeks to achieve all or some of the following objectives:

A first objective of the invention is to provide a photovoltaic device production solution that does not run the risks associated with the interconnections of the prior art.

A second objective of the invention is to provide a photovoltaic device production solution that simplifies mechanical and/or electrical assembly of a number of photovoltaic modules.

For this purpose, the invention is based on a photovoltaic module comprising a plurality of electrically connected photovoltaic cells, characterized in that it has a square shape and comprises at least two contact pads in each corner of the module so as to comprise at least four connectors on each edge of the module.

The invention is more precisely defined by the claims.

The photovoltaic module may comprise a cable connecting all the cells, comprising a first end connected to a first contact pad of positive polarity on one edge of the module, passing through a second contact pad of the same polarity on a second adjacent edge, then all the cells of the module in order to electrically connect them in series, then passing through a third contact pad of negative polarity on a third edge, before reaching a fourth contact pad on a fourth edge.

As a variant, the photovoltaic module may comprise more than one cable connecting all the cells, comprising a first end connected to a first contact pad of positive polarity on one edge of the module, passing through a second contact pad of the same polarity on a second adjacent edge, then all the cells of the module in order to electrically connect them in series and in parallel, then passing through a third contact pad of negative polarity on a third edge, before reaching a fourth contact pad on a fourth edge.

The invention also relates to a photovoltaic device, characterized in that it comprises a plurality of electrically and mechanically connected photovoltaic modules such as described above.

The invention also relates to a plant for producing photovoltaic electricity, characterized in that it comprises a plurality of photovoltaic devices such as described above.

The objectives, features and advantages of the present invention will be described in detail in the following description of a particular embodiment, given by way of nonlimiting example and with regard to tie appended figures in which:

FIG. 1 schematically illustrates a photovoltaic module according to the prior art.

FIG. 2 schematically shows a photovoltaic device according to the prior art.

Figure 3:
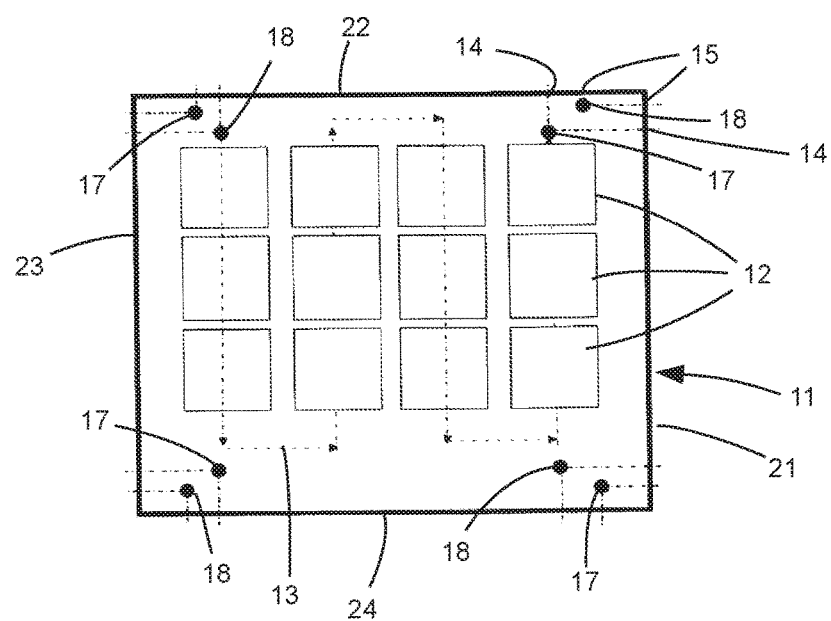

FIG. 3 schematically shows a photovoltaic module according to an embodiment of the invention.

Figure 4:
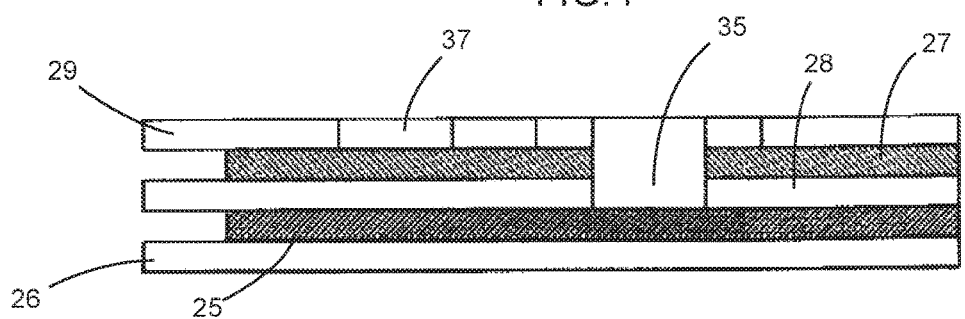

FIG. 4 shows a cross-sectional side view of part of the multilayer structure of a photovoltaic module according to an embodiment of the invention.

Figure 5:
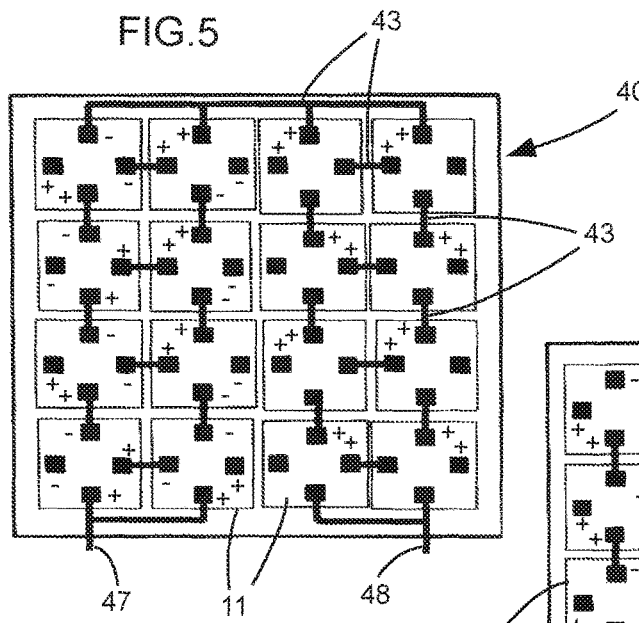
Figure 6:
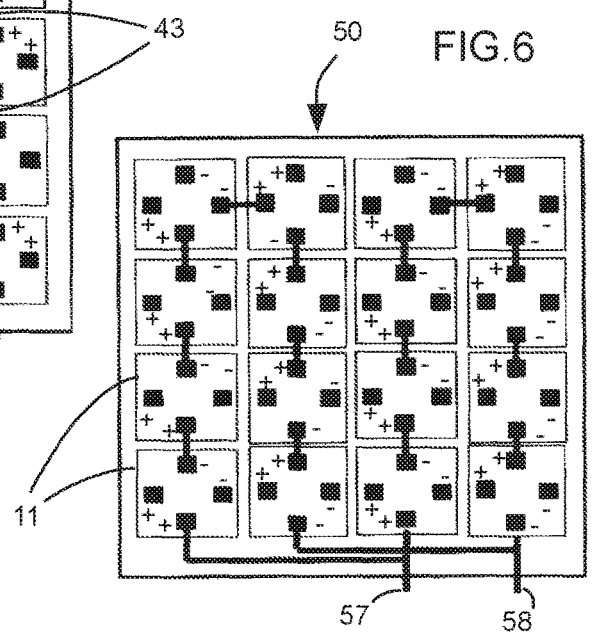
Figure 7:
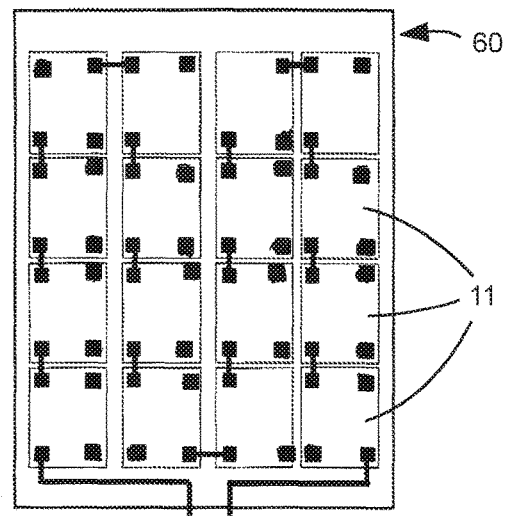

FIGS. 5 to 7 schematically show photovoltaic devices comprising photovoltaic modules according to the embodiment of the invention.

FIG. 3 shows an embodiment of a photovoltaic module 11, which comprises cells 12 integrated into a laminate, as in the conventional solution of the prior art shown in FIG. 1, but arranged in a frame the outline of which is square. For the sake of simplicity the module is said to be square in shape. The various cells 12 are connected together in series by a cable 13. As a variant (not shown) the cells could be connected in a matrix by more than one cable 13.

The module 11 comprises connectors 14, 15 placed near the corners of the module. Specifically, two contact pads 17, 18 of positive and negative polarity, respectively, are arranged in the vicinity of each corner of the module. Each contact pad 17, 18 is connected to two connectors 14, 15 shared over the two adjacent edges of the module located around this corner where the contact pads are placed. Thus, each edge 21, 22, 23, 24 of the module comprises four connectors, two of each polarity. This embodiment thus makes a multitude of electrical connections possible, thereby making it easier to produce arrays of modules.

It will be noted that, to obtain these various contact pads 17, 18 in a number of locations on the perimeter of the module, one solution, shown in FIG. 4, is based on the production of conductors on insulating layers, and on the stacking of such layers. To do this, the techniques used to fabricate integrated circuits may be employed to form conductors, made of copper or aluminium for example, etched on insulating layers comprising a polymer, such as PET, epoxy or polyamide for example, to form a multilayer assembly. Thus, FIG. 4 schematically illustrates an example in which a first conductor 25 is formed by metallization of a first insulating layer 26, and a second conductor 27 is formed on a second insulating layer 28 that is superposed on the first. A last insulating layer 29 covers the assembly. In this assembly, a first recess 35 is produced in this structure, superposed on the first conductor 25, in order to allow a connection to be made with this conductor. This recess therefore passes through the surface insulating layer 29 and the second insulating layer 28 comprising the second conductor 27. A second recess 37 is produced in the surface insulating layer 29 alone in order to allow electrical connection with the second conductor 27. As a variant, wires or strips clad with insulating claddings may cross in the thickness of the module, without risk of short-circuit, in order to reach the various peripheral connectors.

Thus, in this embodiment a multilayer laminate in which conductive strips (of between 100 and 300 µm in thickness inclusive) inserted between insulating layers (made of PET, PVF, etc.) are superposed, may be used. Contact may be made using various types of welded or spring-loaded connectors.

As a variant, this embodiment may be obtained using equipotential planes produced by electrochemical or electrolytic deposition (between 10-100 µm in thickness): a rigid (glass, epoxy fibre, PET, etc.) plate is for example covered on both its sides with a conductive metal, for example made of flexible aluminium or copper, each of the sides representing a polarity. A contact is then produced by welding a conductive strip to the corners.

Different cabling patterns may furthermore be used to connect the various cells of a module together, as may be seen in the various implementations shown by way of non-limiting example. Series connection has the advantage of maximizing the output voltage of the module. Parallel connection makes automatic current balancing possible, for example when the cells are not identically illuminated.

FIG. 5 shows a first implementation of the module according to the embodiment. Sixteen modules 11 are connected together by electrical connections 43 to form a photovoltaic device 40. The cabling pattern of these modules is such that it forms a path with a matrix architecture between the two output, terminals 47, 48 of the device.

FIG. 6 shows a second implementation, again comprising sixteen modules arranged in the same mechanical configuration, grouped in the form of two strings of eight modules 11 connected in series, these two strings being arranged in parallel between the two output terminals 57, 58 of the photovoltaic device 50.

It will be noted that, for the sake of legibility, the contacts 14, 15 located on the edges of the modules 11 have not all been shown. Furthermore, those shown are positioned in the centre of the edges, but they could be closer to a corner.

FIG. 7 shows an implementation of a module 11 according to this embodiment, forming a photovoltaic device 60 made up of an array of sixteen modules 11 electrically connected in series and mechanically connected in four columns of four modules so as to form a compact square array of minimum size, as in the two embodiments shown in FIGS. 5 and 6. It will be noted that this compact device is the same size as the prior art device shown in FIG. 2, shown beside FIG. 7 in order to make comparison easier. This volume saving is obtained, by virtue of the new module architecture according to the invention, by a substantial simplification and reduction of the cabling, as explicitly shown in the figure.

Thus, the above approach increases the flexibility and simplicity of the mechanical assembly of the modules, which may be grouped near one another to form arrays that are square, or rectangular, or even any other shape in geometry. In addition, the position of the electrical connectors means that there is a wide range of possible choices for connecting the various modules, whether in series and/or parallel or in a matrix. This approach thus allows the overall size of arrays of modules to be minimized while simplifying their electrical connection, reducing their cost and increasing their reliability.

The invention claimed is:

1. A plant comprising a first Photovoltaic module and a second photovoltaic module, wherein the first photovoltaic module comprising: a plurality of electrically connected photovoltaic cells,
   wherein a light receiving surface of said first photovoltaic module has a square shape and comprises at least two contact pads of negative and positive polarity, respectively, in each corner of said light receiving surface,
   for each corner each contact pad of the at least two contact pads is connected to two connectors not shared with the other one of the at least two contact pads,
   for each corner, said two connectors are shared over two adjacent edges of the first photovoltaic module located around that corner of the first photovoltaic module where the respective contact pad is placed, so that each edge of the first photovoltaic module comprises four connectors, wherein the four connectors are formed by said two connectors of each contact pad and include two connectors of each polarity placed near each corner,
   wherein the four connectors of each edge of the first photovoltaic module directly electrically connect the first photovoltaic module to the second photovoltaic module.

2. The plant according to claim 1, wherein each contact pad of the at least two contact pads has a multilayer structure and comprises an electrical connection via at least one conductor etched in insulating layers of the multilayer structure, and at least one recess in order to allow contact with said at least one conductor.

3. The plant according to claim 1, wherein each contact pad of the at least two contact pads comprises equipotential layers produced by electrochemical or electrolytic deposition comprising a rigid plate made of glass, epoxy fibre or PET, wherein a first and a second side of said rigid plate is covered with a conductive metal selected from a group consisting of flexible aluminum and copper, each of the first side and the second side representing a polarity.

4. The plant according to claim 1, wherein said first photovoltaic module comprises an electrical connection via at least one insulated conductive strip located in a thickness of the first photovoltaic module.

5. The plant according to claim 1, wherein said first photovoltaic module comprises sixteen connectors formed by said two connectors of each contact pad, arranged around the light receiving surface perimeter of the first photovoltaic module, with no other wires running from the first photovoltaic module.

6. The plant according to claim 1, wherein the first photovoltaic module and the second photovoltaic module are connected in an array forming a rectangle or a square wherein the first photovoltaic module and the second photovoltaic module are connected in series or in parallel or in a matrix structure.

* * * * *